Jan. 11, 1966 J. J. WILTING 3,229,226

FREE-RUNNING CONTROLLED RECTIFIER INVERTER CIRCUIT

Filed April 7, 1961 2 Sheets-Sheet 1

INVENTOR

JOHANNES J. WILTING.

BY Frank R. Jeifari

AGENT

Jan. 11, 1966 J. J. WILTING 3,229,226

FREE-RUNNING CONTROLLED RECTIFIER INVERTER CIRCUIT

Filed April 7, 1961 2 Sheets-Sheet 2

INVENTOR
JOHANNES J. WILTING

BY
Frank R. Jeffrey
AGENT

United States Patent Office 3,229,226

Patented Jan. 11, 1966

3,229,226
FREE-RUNNING CONTROLLED RECTIFIER INVERTER CIRCUIT

Johannes Jacobus Wilting, Emmasingel, Eindhoven, Netherlands, assignor to North American Philips Company, Inc., New York, N.Y., a corporation of Delaware Filed Apr. 7, 1961, Ser. No. 101,572
Claims priority, application Netherlands, Apr. 8, 1960, 250,333
6 Claims. (Cl. 331—113)

This invention relates to electrical converters and in particular to free-running electrical converters utilizing controlled semi-conductor rectifiers.

Controlled semi-conductor rectifiers, also referred to as thyristors, are known per se; they have properties comparable to those of thyratrons and permit the switching of comparatively large currents.

In the non-conductive condition, the thyristor is blocked in both directions except for a small leakage current of the order of one or a few milliamperes. The leakage current becomes inadmissibly large and/or a break-down occurs at a comparatively high voltage for silicon thyristors, it may be of the order of a few hundred volts.

The thyristor can be rendered conductive in one direction by a small current injection of short duration. The permissible currents are then high. For example, thyristor types are available for peak currents of 150 amperes. Even with large currents, the voltage drop across a thyristor is slight, that is to say of the order of one volt, as compared with that across a thyratron, which is of the order of ten volts. Hence, the losses in the thyristor are small and a current conversion by means of thyristors may, therefore, take place at considerably higher levels of energy and voltage than is possible with transistors.

A thyristor is rendered non-conductive after being conductive when the current passed falls below a low limit value, the so-called holding current. Below this value, charge carriers are no longer produced in the thyristor in numbers sufficient to maintain its nominal conductivity.

The left-hand portion of FIG. 1 shows a diagram of a known type of controlled semi-conductor rectifier of thyristor having the same structure as a junction transistor of the NPNP-type, an emitter 1 being of N-type, a base 2 of P-type and a so-called "hook collector" 3 comprising two layers of N- and P-type respectively. In the terminology of controlled rectifiers, these electrodes are also designated as follows: the term "source" is used instead of emitter, the term "gate" instead of base and "drain" of sometimes anode instead of collector. In the absence of a serviceable and generally recognized terminology, the expressions emitter, base or control electrode and collector will be used hereinafter.

When using a thyristor in a converter, the thyristor must be brought alternately and with a certain periodicity from the non-conductive condition to the conductive condition and conversely.

Owing to the fact that the current through an ignited thyristor cannot be interrupted unless the latter is spontaneously extinguished, the application of the known principle of regenerative feed-back to render a converter free-running gives rise to a number of problems.

Firstly, a semi-conductor rectifier or thyristor is not an amplifier element with which a free-running circuit can be realized by applying regenerative feed-back to an amplifier having an open-circuit amplification exceeding unity. Hence, a different procedure must be followed, deriving from the current or voltage variations in the output circuit a series of pulses which have a certain phase relationship with respect to these variations.

Secondly, this phase relationship has to allow for the fact that, owing to storage of free charge carriers, the thyristor has an inherent delay time which is not negligible.

The thyristor switching-on speed is high: its switching-on time does not exceed a few μsec. However, its switching-out time is longer and may be of a few tens of μsec. In practice, this latter period is also determined by the circuit and by further operating conditions; therefore, the determination of the elapsed time between the instant at which the thyristor would become non-conductive, if its switching-out time was zero, and the instant from which it is effectively blocked, are preferably made from measurements in a given circuit. This switching-out time not only limits the operating frequency but also makes necessary the determination that no unnecessarily large number of free charge carriers are injected into the base zone shortly before the instant at which the thyristor will have to be extinguished; the ignition voltage must, therefore, be in the form of a short sharp pulse of a nature greatly different from that of the current passed during one half cycle, and which has to be terminated a sufficient period of time before the instant at which the thyristor has to be extinguished.

Thirdly, the switching-on losses, and hence the energy lost in the form of these ignition pulses, should be reduced to a minimum. Therefore the amplitude of these pulses should not be chosen unnecessarily high and they should be as short as possible.

The present invention relates to a free-running converter comprising at least one controlled semi-conductor rectifier and an output circuit including inductive and capacitive elements excited via the rectifier by a source of voltage to be transformed and co-determining the operating frequency of the converter. It is an object of the invention to provide a particularly simple and satisfactory converter of this type.

According to one aspect of the converter according to the invention, its output circuit is coupled to a load by which it is undercritically damped and, through a feedback element having bistable states, to the circuit of the control electrode of the rectifier; after each passage through zero of the current flowing through a reactive element of the output circuit, the feedback element changes over from one stable state to the opposite stable state with an adjustable time delay, so that pulses are produced which are supplied to the control electrode of the rectifier as firing pulses.

Preferably the feedback element comprises a core of a ferromagnetic material having a substantially rectangular hysteresis loop, the core being provided with a primary winding coupled to the output circuit of the converter and with a secondary winding connected to the control electrode of the rectifier. By means of such an element, the phase of the firing pulse can readily be adjusted; for example, this can be done by choosing a ferromagnetic material having the desired coercive force, with the aid of a bias magnetisation or of a time-constant circuit coupled to the feedback element. The pulses thus produced are sufficiently short and sharp and of substantially constant amplitude.

The feedback element can take various forms and can be, for instance a capacitor, the dielectric of which comprises a ferro-electric material, for example barium-titanate.

In order that the invention may readly be carried into effect, embodiments thereof will now be described, by way of example, with reference to the accompanying diagrammatic drawings, in which FIGURE 1 shows two diagrammatic representations of a controlled semi-conductor rectifier.

Figure 1:
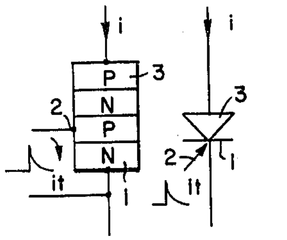

The right-hand part of FIGURE 1 shows a symbol commonly used for representing a controlled semi-conductor rectifier or thyristor. Its emitter 1, which may be of N-type, is represented similarly to the cathode of a diode. Its control electrode or base 2, which may be of P-type, is shown by an arrow; a "hook collector" 3, which may comprise an N-layer and a P-layer, is shown similarly to the anode of a diode.

Figure 2:
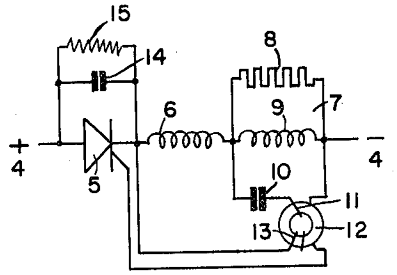
FIGURE 2 is the schematic circuit diagram of a first embodiment.

A first embodiment of the free-running converter comprising a controlled semi-conductor rectifier according to the invention is shown diagrammatically in FIGURE 2. A direct-current source 4 having a positive and a negative terminal is connected to the series combination of a semiconductor rectifier or thyristor 5 and an output circuit comprising an inductor 6 and a load resistor 8 coupled to a circuit 7 comprising inductive and capacitive elements 9 and 10, respectively. The series combination of the inductance 6 and the circuit 7 to which the load 8 is coupled forms an undercritically damped circuit which can be excited by the direct current source 4 through the thyristor 5 at the instant when the thyristor 5 is rendered conductive by means of its control electrode. A winding 11 is connected in series with the capacitor 10. This winding is arranged on a core of a ferromagnetic material having a substantially rectangular hysteresis loop, for example, Ferroxcube. This core 12 carries a second winding 13 connected between the emitter and the control electrode of the thyristor 5 so that a short time after a passage through zero of the current flowing through the branch of the output circuit comprising the capacitor 10 and the winding 11, the core changes over from one remanence state to the other with a certain time delay and produces a pulse in the winding 13. This pulse has the effect of rendering the thyristor 5 conductive again.

In order to render the converter self-starting, a capacitor 14 shunted by a resistor 15 is connected between the emitter and collector of the thyristor. The resistor 15 allows only a very small direct current to flow, while at the instant at which the converter is connected to the terminals of the source 4, a voltage pulse is applied through the capacitor 14 to the output circuit, which pulse provides the first excitation of this circuit. The resistor 15 serves to discharge the capacitor 14 when the converter is switched off.

Figure 3:
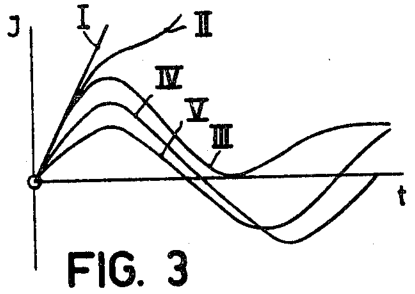
FIGURES 3 and 4 are diagrams illustrating the operation of this embodiment.

The operation of the circuit arrangement shown in FIGURE 2 will now be discussed with reference to the diagrams of FIGURES 3 and 4, which show the variation of the current through the circuit 6, 7 as a function of time. The output circuit comprising the inductor 6 and the circuit 7 has an inductive character. If the circuit 7 were heavily damped, for example substantially short-circuited, by the resistor 8, then the current through this circuit would increase substantially linearly when the converter is switched on, as is shown by the curve I of FIGURE 3. If the circuit 7 were damped somewhat less heavily, the influence of the capacitive element 10 of this circuit would be felt, so that the increase of the current on switching on would have a variation substantially of the form shown by the curve II of FIGURE 3. For a critical value of the resistor 8, the current through the load circuit would first increase and reach a maximum value, then decrease to zero value and subsequently increase less steeply, as is shown by the curve III of FIGURE 3. If the circuit 6, 7 were not loaded or damped at all, the current through this circuit after an initial excitation would be sinusoidal, as is shown by the curve V of FIGURE 3. In order to ensure the operation of the converter, the effective inductance of the winding 9 must be as large as possible and must at least exceed $\pi$ times the inductance of the inductor 6, its value being correspondingly increased when the converter is loaded. Furthermore the load resistor 8 must have a value such that the circuit 6, 7 is undercritically damped, so that the variations of the current through this circuit approximate curve IV of FIGURE 3, which is intermediate between the curves III and V.

Figure 4:
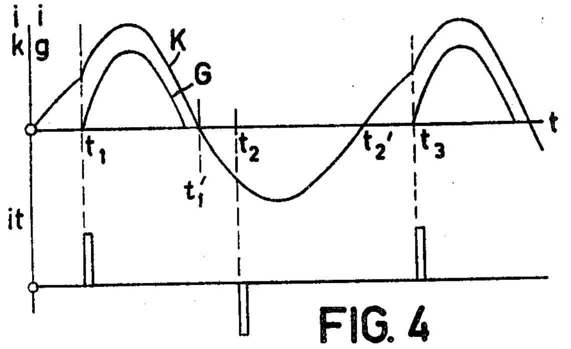

FIGURE 4 also shows the variation of the current through the circuit 6, 7 as a function of time, with the asumption that this circuit is undercritically damped and that the thyristor 5 becomes conductive regularly and each time with a suitable phase. At an instant $t_1$, the thyristor 5 has just become conductive again so that the increase of the current $i_k$ through the circuit 6, 7 suddenly becomes much steeper, as is shown by the curve K. The curve G of FIGURE 4 shows the current $i_g$ through the thyristor 5. When the current $i_k$ decreases again and becomes zero, the current $i_g$ through the thyristor also becomes zero and the thyristor is extinguished. However, the current $i_k$ continues and at an instant $t_2$ the core 12 changes over from one stable state to the other, so that a pulse is produced across the winding 13. However this pulse $i_t$ is negative, so that the thyristor 5 remain blocked. At the instant $t_3$, ater a second passage through zero of the current $i_k$, the core 12 again changes over into its first stable state and as a result produces a positive pulse by which the thyristor 5 is brought to its conductive condition.

In the converter described comprising only a single thyristor, there is no risk of re-ignition; when the current through the thyristor has decreased to about zero at the instant $t_1'$ (FIGURE 4), the voltage across the thyristor is reversed for a full half cycle $t_1'$–$t_2'$. This time is amply sufficient for the free charge carriers still present in the thyristor at the instant $t_1'$ to disappear.

In converters comprising a plurality of alternately conducting thyristors, a non-conducting thyristor should generally not be fired before the conducting thyristor is completely blocked, i.e., not before the greater part of the free charge carriers stored in the conducting thyristor have flowed away. Consequently, each thyristor has to be fired only after a certain minimum time delay with respect to the instant at which the current through the preceding thyristor ceases.

Figure 5:
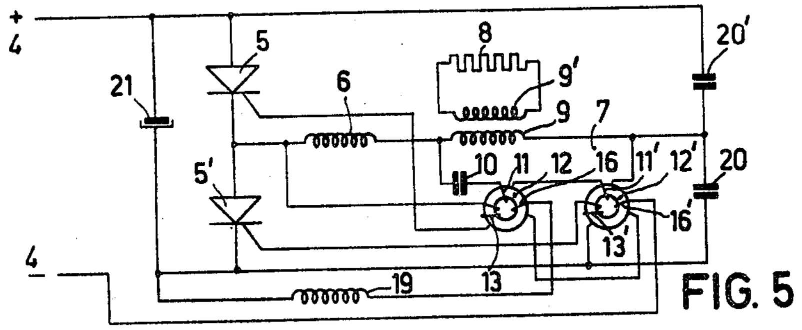
FIGURES 5 and 6 are the schematic circuit diagrams of two further embodiments.

FIGURE 5 is a circuit diagram of a second embodiment of a converter in accordance with the invention. This embodiment comprises two thyristors 5 and 5' which are connected in series across the voltage source 4 and are alternately rendered conductive. The output circuit of the converter again comprises an inductor 6 and a circuit 7 containing an inductor 9 and a capacitor 10. A load resistor 8 is coupled to the output circuit 6, 7 by means of a winding 9' coupled to the inductor 9. Two windings 11 and 11' are connected, in series with the capacitor 10, in the capacitive branch of the circuit 7. The windings 11 and 11' are each wound on a core 12 and 12' respectively, made of a ferromagnetic material having a substantially rectangular hysteresis loop. These cores each carry a further winding 13 and 13' respectively, connected between the emitter and control electrode of the thyristor 5 and 5', respectively. Each core further has wound upon it a third winding 16 and 16', respectively, which are connected in series with one another and oppositely wound across a source of direct current. In the embodiment shown, this source is constituted by the source 4 in the following manner: one of the terminals of the source 4 is connected to the corresponding input terminal of the converter through the series combination of the windings 16 and 16' and a decoupling choke coil 19. Finally the output circuit is completed by two capacitors 20 and 20' connected to the collector of the thyristor 5 and to the emitter of the thyristor 5', respectively, the series combination of these two thyristors being shunted by a smoothing capacitor 21.

Alternatively, only one of the two capacitors 20 and 20' might be used, the other being omitted. This has the disadvantage that it intereferes with the symmetry of the circuit arrangement, and the effective value of the alternating current through the load resistor 8 corresponding to a certain maximum peak value of the current pulses delivered by the source 4 is reduced. However, the elimination of one capacitor and the consequent economy is worthwhile if the direct-current source is capable of delivering comparatively high current peaks once in each cycle. The capacitor 21 serves to smooth the voltage across the windings 16 and 16' and the choke coil 19.

It will be appreciated that, if for example the thyristor 5' and the capacitor 20' were omitted, the circuit arrangement shown in FIGURE 5 would operate in the same manner as the circuit arrangement shown in FIGURE 2, with the difference that the load circuit also includes the series capacitor 20 which is charged via the thyristor 5. The thyristor 5' serves to discharge the capacitor during the period in which the thyristor 5 is non-conductive, and the same applies to the capacitor 20' which is charged via the thyristor 5' and discharged via the thyristor 5. Consequently, the circuit arrangement shown in FIGURE 5 operates in principle as a series push-pull output circuit. Positive firing pulses are alternately applied to the control electrodes of the thyristors 5 and 5' by the windings 13 and 13', respectively.

The current flowing through the windings 16 and 16' produces a bias magnetisation in opposite directions in the cores 12 and 12' and the magnitude this bias magnetisation can be adjusted by the choice of the number of turns of the windings 16 and 16'. Variation of the bias magnetisation of each core allows a variation of the time delay (for example $0-t_1$) between the passage through zero of the current $i_k$ and the production of a firing pulse $i_t$ (FIGURE 4). This delay is substantially independent of the load current, since the currents through the windings 11 and 11' and the currents through the windings 16 and 16' increase simultaneously and to substantially equal extents with the load.

Figure 6:
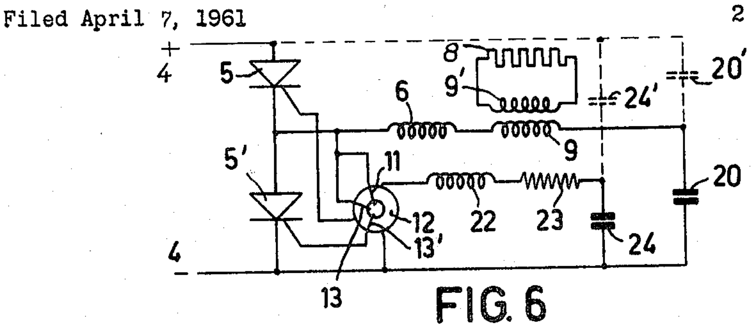

FIGURE 6 shows a third embodiment which is slightly simplified as compared with the embodiment shown in FIGURE 5. Two thyristors 5 and 5' are again connected in series with one another and in the pass direction across a source 4 of direct voltage, and an output circuit is connected between the junction point of these two thyristors and one or both therminals of the source 4. This output circuit again comprises an inductor 6 connected in series with a second inductor 9 acting as a coupling winding and with a capacitor 20 which completes the circuit and is connected to the negative terminal of the source 4. This capacitor may again be replaced by a capacitor 20' shown in broken lines and connected to the positive terminal of the source 4, or the output circuit can contain two capacitors 20 and 20' in order to make the converter symmetrical. A load resistor 8 is coupled to the output circuit by means of a winding 9' coupled to the inductor 9. This output circuit is also coupled to windings 13 and 13' provided on a core 12 made of a ferromagnetic material having a substantially rectangular hysteresis loop. This coupling is effected by means of a third winding 11 on this core which is connected in an energising circuit connected in parallel with the output circuit and comprising an inductor 22, a resistor 23 and a capacitor 24 connected in series with one another and with the winding 11. The windings 13 and 13' are each connected between the emitter and the control electrode of the thyristor 5 and 5' respectively, the two windings 13 and 13' being wound in opposite directions. The inductor 22 ensures a certain time delay of the increase of the current through the winding 11, and the time constant of the resistor 23 and the capacitor 24 increases this delay. Hence, both the amplitude and the time delay of the firing pulses produced can be adjusted to the desired value by varying the values of the inductor 22, the resistor 23 and the capacitor 24. Finally, the energizing circuit for the core 12 comprising the winding 11, the inductor 22, the resistor 23 and the capacitor 24, can also be rendered symmetrical with the aid of a second capacitor 24' shown in broken lines.

Figure 7:
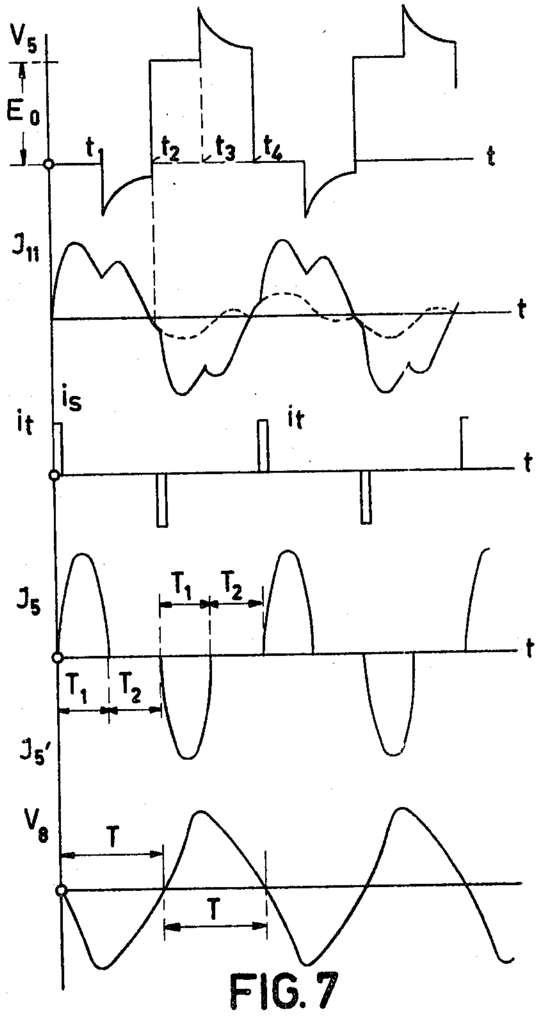
FIGURE 7 is a diagram illustrating the operation of the embodiment shown in FIGURE 6.

FIGURE 7 shows a number of diagrams illustrating the operation of the circuit arrangement of FIGURE 6. The upper diagram of FIGURE 7 shows the voltage $V_5$ across the thyristor 5. It is assumed that, at the instant 0, the thyristor 5 is conductive and hence the voltage $V_5$ is substantially 0. At the instant $t_1$, the thyristor 5 is extinguished and, owing to the persistent oscillation of the output circuit, its emitter becomes suddenly positive with respect to its collector. At the instant $t_2$, the thyristor 5' becomes suddenly conductive so that the voltage across the thyristor 5 becomes substantially equal to the voltage $E_0$ of the supply source 4. At the instant $t_3$, the thyristor 5' is again extinguished and the voltage across the thyristor 5 rises above the value of the input voltage $E_0$ owing to the persistent oscillation of the output circuit. The voltage across the thyristor 5 decreases approximately exponentially until the instant $t_4$ at which time this thyristor is again rendered conductive when the voltage $V_5$ is still slightly greater than the input voltage $E_0$. Then the entire process is repeated.

The second diagram of FIGURE 7 shows the current $I_{11}$ through the energising winding 11 of the core 12. At the instant 0, the capacitor 24 begins to discharge through the circuit comprising the winding 11, the inductor 22, the resistor 23, and the thyristor 5. This discharge current initially increases rapidly and subsequently decreases according to a heavily damped oscillation of long period (the peak of the discharge curve being rounded by the inductor 22 and the winding 11). At the instant $t_1$, the thyristor 5 extinguishes and part of the energy stored in the output circuit produces a second, smaller increase of the current through the winding 11, which again decreases according to a heavily damped oscillation of long period. If the thyristors 5 and 5' should not be refired, this current would decay in the manner indicated in broken lines. Just before the instant $t_2$, the current $I_{11}$ passes through zero; immediately thereupon, the core 12 changes over from one state of remanence to the opposite state and produces, in the windings 13 and 13', a pulse which suddenly renders the thyristor 5' conductive. Between the instants $t_2$ and $t_4$, the variation of the charging current of capacitor 24 and hence of the current $I_{11}$, is again similar to its variation between the instants 0 and $t_2$; however, the direction of the variation is reversed. At the instant $t_4$, the current $I_{11}$ again changes sign, so that a firing pulse is produced in the windings 13 and 13', and the thyristor 5 is rendered conductive. Then the entire process is repeated.

The third diagram of FIGURE 7 shows the firing pulses $i_t$ across the winding 13. The negative pulses have no influence upon the condition of the thyristor 5 but correspond with positive pulses across the winding 13' which produce the periodic firing of the thyristor 5'.

The fourth diagram of FIGURE 7 shows the currents $I_5$ and $I_5'$ through the thyristors 5 and 5' respectively, a forward current through the thyristor 5 being shown upwards and a forward current through the thyristor 5' being shown downwards. The conductivity periods are designated $T_1$ and the delay periods are denoted $T_2$.

Finally, the voltage $V_8$ across the load resistor 8 is shown in the last diagram of FIGURE 7. As will be seen from this diagram, this voltage is substantially sinusoidal owing to the flywheel action of the undercritically damped output circuit. The repetition period of the passages through zero of the current flowing through this circuit is hence equal to the sum of the conductivity period $T_1$ and of the delay period $T_2$ and also to one half cycle T of the substantially sinusoidal voltage across the load resistor 8.

Both in the embodiment according to FIGURE 5 and in that according to FIGURE 6, each thyristor 5 or 5′ is only fired with a certain time delay $t_3$—$t_4$ and $t_1$—$t_2$ respectively (FIG. 7) after the current through the other thyristor has again become substantially zero. This time delay should exceed the switching out time of the thyristors used.

In the embodiment shown in FIGURE 5, this minimum time delay can be influenced by the choice of the number of turns of the windings 11 and 11′ and/or by the bias magnetisation of the cores 12 and 12′, the ratio between the members of turns of the windings 11 and 13 or 11′ and 13′, respectively, influencing the amplitude of the firing pulses. In the embodiment shown in FIGURE 6, the bias magnetisation is replaced, as regards the time delay, by the time constant of the circuit 11, 22, 23, 24 or 24′, or 24 and 24′.

In the first diagram of FIGURE 7, the time delay between the extinction of the thyristor 5 and the ignition of the thyristor 5′ is equal to $t_2$—$t_1$ and the equal time delay between the extinction of the thyristor 5′ and the ignition of the thyristor 5 is equal to $t_4$—$t_3$. If this time delay was shorter than the switching-out time of the thyristors used the thyristor 5 or 5′ might under certain circumstances be refired at an instant at which the other thyristor is already conductive. This would cause the source 4 to be short-circuited through the series connected thyristors and might lead to the destruction of the thyristors.

In the embodiment shown in FIGURE 6, the decreasing discharge or charge current of the capacitor 24 suddenly increases again at the instant $t_1$ or $t_3$ respectively at which the thyristor 5 or 5′ is extinguished.

While several embodiments of the new and improved converter using thyristors have been described, these have been shown for illustrative purposes only, since other modifications and variations will be readily apparent to those skilled in the art.

What is claimed is:

1. A self-excited oscillator for converting the voltage of direct-current supply source having two terminals into an alternating voltage, comprising one controlled rectifier having a cathode electrode, an anode electrode, a control electrode and an anode-cathode path, an output circuit including at least one inductive element, one capactive element and a feedback element having two stable states and comprising a core of ferromagnetic material having a substantially rectangular hysteresis loop and primary and secondary windings inductively coupled to said core, said elements forming a tuned circuit and said output circuit being connected across the terminals of said supply source in series with said anode-cathode path, a load coupled to said tuned circuit, said tuned circuit being undercritically damped by said load, said output circuit being connected to said primary winding, said control electrode being connected to said secondary winding, whereby said control circuit is coupled to said output circuit through said feedback element, said feedback element changing over from one stable state to the other stable state after each passage through zero of the current flowing through said output circuit and producing voltage pulses in said secondary winding which are applied to said control electrode.

2. An oscillator as claimed in claim 1, further comprising a third winding inductively coupled to said core, and means for supplying said third winding with a direct bias current.

3. A self-excited oscillator for converting the voltage of a direct-current supply source having two terminals into an alternating voltage, comprising two controlled rectifiers each having a cathode electrode, an anode electrode, a control electrode and an anode-cathode path, said anode-cathode paths being connected in series with each other across said supply source, an output circuit including at least one inductive element, one capacitive element and one feedback element having two stable states and comprising a core of ferromagnetic material having a substantially rectangular hysteresis loop and a primary and two secondary windings coupled to said core, said secondary windings being wound in opposite senses on said core, said elements forming a tuned circuit and said output circuit being connected between the junction point of said anode-cathode paths and at least one of said terminals, said primary winding being connected in series with a resistor, an inductor and a capacitor between said junction point and one of said terminals, a load circuit coupled to said tuned circuit, said tuned circuit being undercritically damped by said load circuit, each of said secondary windings being respectively connected to the control electrode of one rectifier, said feedback element changing over from one stable state to the other stable state after each passage through zero of the current flowing through said output circuit and producing voltage pulses in said secondary windings which are applied to respective control electrodes.

4. An oscillator as claimed in claim 3, wherein said output circuit includes two capacitors connected respectively to the two terminals of said direct-current supply source.

5. A self-excited oscillator for converting the voltage of a direct-current supply source having two terminals into an alternating voltage, comprising two controlled rectifiers each having a cathode electrode, an anode electrode, a control electrode and an anode-cathode path, said anode-cathode paths being connected in series with each other across said supply source, an output circuit including at least one inductive element, one capacitive element and a pair of feedback elements each having two stable states and comprising a core of ferromagnetic material having a substantially rectangular hysteresis loop, a primary winding and a secondary winding coupled to each core, a third winding coupled to each core, said elements forming a tuned circuit and said output circuit being connected between the junction point of said anode-cathode paths and at least one of said terminals, said primary windings being connected in series with each other in said tuned circuit and being wound on said cores in the same sense, each of said secondary windings being respectively connected to the control electrode of one rectifier, a circuit coupled to said tuned circuit, said tuned circuit being undercritically damped by said load, said cores changing over from one stable state to the other stable state after each passage through zero of the current flowing through said output circuit and producing voltage pulses in said secondary windings which are applied to respective control electrodes.

6. An oscillator as claimed in claim 5, wherein said output circuit includes two capacitors connected respectively to the two terminals of said direct-current supply source.

References Cited by the Examiner

UNITED STATES PATENTS

| | | | |
|---|---|---|---|
| 2,952,818 | 9/1960 | Russell et al. | 331—113 |
| 3,019,355 | 1/1962 | Morgan | 307—88.5 |
| 3,034,015 | 5/1962 | Schultz | 315—97 |
| 3,119,058 | 1/1964 | Genuit | 307—88.5 |
| 3,120,633 | 2/1964 | Genuit | 307—88.5 |
| 3,120,634 | 2/1964 | Genuit | 307—88.5 |

OTHER REFERENCES

"Solid-State Thyratron Switches Kilowatts," Frenzel et al., in Electronics, Mar. 28, 1958.

ROY LAKE, *Primary Examiner.*

JOHN KOMINSKI, *Examiner.*